(12) United States Patent
Eggler et al.

(10) Patent No.: US 11,916,445 B2
(45) Date of Patent: Feb. 27, 2024

(54) ROTOR FOR AN ELECTRIC MACHINE AND ELECTRIC MACHINE HAVING A ROTOR WITH ROTOR HAVING A COOLED NANOGENERATOR USED TO SUPPLY POWER TO SENSING DEVICE

(71) Applicant: ZF Friedrichshafen AG, Friedrichshafen (DE)

(72) Inventors: Jochen Eggler, Waldburg (DE); Ulrich Kehr, Tettnang (DE); Bernd Vahlensieck, Markdorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 20 days.

(21) Appl. No.: 17/569,111

(22) Filed: Jan. 5, 2022

(65) Prior Publication Data
US 2022/0271626 A1 Aug. 25, 2022

(30) Foreign Application Priority Data
Feb. 19, 2021 (DE) ...................... 10 2021 201 601.4

(51) Int. Cl.
*H02K 1/276* (2022.01)
*H02K 9/193* (2006.01)
(Continued)

(52) U.S. Cl.
CPC ............. *H02K 11/25* (2016.01); *H02K 1/276* (2013.01); *H02K 9/193* (2013.01); *H02K 9/227* (2021.01);
(Continued)

(58) Field of Classification Search
CPC ........ H02K 11/25; H02K 1/276; H02K 9/193; H02K 9/227; H02K 1/2766; H02K 9/19;
(Continued)

(56) References Cited

U.S. PATENT DOCUMENTS 3,152,271 A * 10/1964 Yamano ................. H02K 11/25
136/212
3,479,541 A * 11/1969 Robinson ................. H02K 9/20
310/64
(Continued)

FOREIGN PATENT DOCUMENTS

CN 109995176 A * 7/2019
DE 102006021489 A1 11/2007
(Continued)

OTHER PUBLICATIONS

DE202018103227U1 English translation (Year: 2023).*
(Continued)

*Primary Examiner* — Christopher M Koehler
*Assistant Examiner* — Viswanathan Subramanian
(74) *Attorney, Agent, or Firm* — Dority & Manning, P.A

(57) ABSTRACT

A rotor (1) for an electric machine (2) includes at least one sensor element (3) configured for detecting condition variables of the rotor (1), a signal processing unit (4) connected to the at least one sensor element (3) and configured for generating measured data from the detected condition variables of the rotor (1) and transmitting the measured data to a control device (5), and a nanogenerator (6) configured for generating electrical energy from at least one surroundings variable and supplying the at least one sensor element (3) and the signal processing unit (4) with electrical energy.

14 Claims, 3 Drawing Sheets

(51) Int. Cl.
  *H02K 9/22* (2006.01)
  *H02K 11/25* (2016.01)
  *H10N 10/13* (2023.01)
  *B60K 1/00* (2006.01)
(52) U.S. Cl.
  CPC ............... *H10N 10/13* (2023.02); *B60K 1/00* (2013.01); *B60K 2001/003* (2013.01)
(58) Field of Classification Search
  CPC .......... H02K 11/20; H02K 11/35; H02K 1/32; H10N 10/13; B60K 1/00; B60K 2001/003; B60K 11/02; H02J 7/32; H02N 11/002
  See application file for complete search history.

(56) References Cited

U.S. PATENT DOCUMENTS

| | | | | |
|---|---|---|---|---|
| 2002/0038192 | A1* | 3/2002 | Klaar | G01K 13/08 702/132 |
| 2011/0273121 | A1* | 11/2011 | Wan | H02K 5/225 310/71 |
| 2012/0244404 | A1* | 9/2012 | Obasih | H01M 10/6551 429/120 |
| 2013/0342052 | A1* | 12/2013 | Turnbull | H02K 5/18 310/64 |
| 2015/0194862 | A1* | 7/2015 | Sigler | H02K 5/20 310/64 |
| 2016/0123272 | A1* | 5/2016 | Neuendorf | F02F 3/00 123/193.6 |

FOREIGN PATENT DOCUMENTS

| | | | | |
|---|---|---|---|---|
| DE | 102014213446 A1 | * | 1/2016 | ............. H02K 29/06 |
| DE | 202018103227 U1 | * | 10/2019 | ........... H02H 7/0852 |
| WO | WO 2007/128673 | | 11/2007 | |
| WO | WO-2010124665 A1 | * | 11/2010 | ............ G01J 5/0022 |

OTHER PUBLICATIONS

CN109995176A English translation (Year: 2023).*
WO2010124665A1 English translation (Year: 2023).*
DE102014213446A1 English translation (Year: 2023).*

* cited by examiner

ROTOR FOR AN ELECTRIC MACHINE AND ELECTRIC MACHINE HAVING A ROTOR WITH ROTOR HAVING A COOLED NANOGENERATOR USED TO SUPPLY POWER TO SENSING DEVICE

CROSS-REFERENCE TO RELATED APPLICATION

The present application is related and has right of priority to German Patent Application No. 102021201601.4 filed in the German Patent Office on Feb. 19, 2021, which is incorporated by reference in its entirety for all purposes.

FIELD OF THE INVENTION

The invention relates generally to a rotor for an electric machine. The invention further relates generally to an electric machine having a rotor of this type. The invention also relates generally to a vehicle having an electric machine.

BACKGROUND

For example, DE 10 2006 021 489 A1 discloses an electric machine having a stator and a rotor. The electric machine is designed as a permanent-magnet synchronous machine, wherein the rotor includes a rotor body having permanent magnets arranged in the interior of the rotor body as well as flux barriers. The permanent magnets form poles of the electric machine, wherein at least one permanent magnet is arranged in the area of each pole.

In order to be able to optimally operate an electric machine, it is significant, in particular, to determine condition variables of the rotor by sensors and make the condition variables available to a control device of the electric machine. Previously it has been difficult to supply such sensors, which are associated with the rotor of the electric machine and rotate together with the rotor, with sufficient electrical energy.

For example, the continuous power of an electric machine is limited, among other things, by the maximum permissible temperature of the rotor, in particular of the magnets in the case of a permanent-magnet synchronous machine or of the cage of an induction machine. During the operation of the electric machine, the current rotor temperature is generally not known as a measured quantity and is estimated by via a temperature model. As a result, an allowance must be made for a safety margin for the maximum temperature, and so the electric machine cannot be optimally operated due to this safety margin. If the maximum temperature is exceeded, there is a risk of the electric machine overheating and becoming damaged.

SUMMARY OF THE INVENTION

Example aspects of the present invention provide a rotor for an electric machine, and an electric machine. In particular, the operation of the electric machine is to be improved and the risk of the electric machine overheating is to be reduced by the rotor. Moreover, the rotor is to be easily and quickly installable.

A rotor according to example aspects of the invention for an electric machine includes at least one sensor element, which is configured for detecting condition variables of the rotor, a signal processing unit connected to the at least one sensor element, which is configured for generating measured data from the detected condition variables of the rotor and transmitting the measured data to a control device, and a nanogenerator, which is configured for generating electrical energy from at least one surroundings variable and supplying the at least one sensor element and the signal processing unit with electrical energy.

In other words, the rotor of the electric machine includes the at least one sensor element, optionally multiple sensor elements, as well as the signal processing unit and the nanogenerator. In particular, the at least one sensor element, the signal processing unit, and the nanogenerator are connected to the rotor in a positionally fixed and rotationally fixed manner, i.e., at least arranged thereon, in particular integrated in the rotor.

The nanogenerator is configured for performing energy harvesting, i.e., harvesting energy from the surroundings. By energy harvesting, it is possible to generate small amounts of electrical energy from surroundings variables, for example, from the ambient temperature, from vibrations, or from fluid flows, in order to supply the at least one sensor element and the signal processing unit with electrical energy. As a result, a power supply of the at least one sensor element and of the signal processing unit via collecting rings or batteries is avoided.

The at least one sensor element can be arranged directly at the rotor and, there, immediately detect condition variables of the rotor, in particular a temperature of the rotor, in order to reduce the risk of the electric machine overheating. The at least one sensor element is just as suitable for measuring absolute temperatures as it is for detecting temperature differences. For example, the temperature of the rotor is a condition variable of the rotor. For example, the at least one sensor element is arranged directly at or at least adjacent to the point of origin of the condition variable. A short measuring path between the at least one sensor element and the point of origin of the condition variable increases the measuring accuracy.

In particular, the signal processing unit is wirelessly connected to the control device for signal transmission and/or data transmission. The at least one sensor element is preferably connected to the signal processing unit via wiring for signal transmission and/or data transmission. For example, the control device is arranged outside the rotor, although within the vehicle.

According to one preferred example embodiment of the invention, the nanogenerator is arranged at an end face of the rotor. In particular, the at least one sensor element is arranged at an end face of the rotor. For example, the nanogenerator is arranged adjacent to the at least one sensor element, in particular at an area of the rotor that heats up to a particularly great extent when loaded. The end-face arrangement at least of the nanogenerator, optionally also of the at least one sensor element and the signal processing unit, is advantageous, since the properties of the rotor, in particular the electrical and magnetic properties of the electric machine, are not negatively influenced and the radio transmission is simplified. Moreover, the end face of the rotor is particularly readily accessible not only for the installation, but rather also for maintenance, as the result of which the rotor and the elements arranged thereon, namely the at least one sensor element, the signal processing unit, and the nanogenerator, can be easily and quickly installed.

According to one preferred example embodiment of the invention, the nanogenerator is arranged at a segment of the rotor. For example, the nanogenerator is designed to be essentially plate-shaped, preferably rectangular, and is arranged at a segment, i.e., in a defined area not extending circumferentially at the rotor. As a result, the nanogenerator can be designed to be compact and extends essentially over a small area of the rotor.

According to one alternative example embodiment of the invention, the nanogenerator is arranged circumferentially at the rotor in the shape of a ring. For example, the nanogenerator is designed in the shape of a disk and has an outer circumference and an inner circumference. Consequently, a ring-shaped nanogenerator is rotationally symmetrical and extends circumferentially, in particular at an end face of the rotor. This relatively large nanogenerator offers a relatively large area, which can be cooled around the circumference, in particular by a single spray nozzle, which sprays coolant onto the nanogenerator.

According to one preferred example embodiment of the invention, the nanogenerator is designed as a thermocouple. For example, the nanogenerator is designed as a Peltier element. Accordingly, the nanogenerator generates a voltage as soon as a temperature difference arises between two sides of the nanogenerator. When the rotor heats up, the side of the nanogenerator with which the nanogenerator is attached at the rotor heats up to a greater extent than the side of the nanogenerator that faces away from the rotor, in particular that faces the surroundings. This outwardly facing side of the nanogenerator is therefore colder than the side facing the rotor, and so the nanogenerator generates a voltage and, as a result, the at least one sensor element as well as the signal transmitting unit are supplied with electrical energy.

According to one preferred example embodiment of the invention, a cooling ring is arranged on an end face of the rotor, wherein the cooling ring at least partially or completely covers the nanogenerator. A cooling ring is to be understood as a ring-shaped disk, which is configured for cooling an outer surface of the nanogenerator, in that heat is carried away faster from the outer surface of the nanogenerator, wherein an outer surface of the cooling ring is larger than an outer surface of the nanogenerator. In other words, the side of the nanogenerator that faces away from the rotor, in particular that faces the surroundings, is cooled to a greater extent by the cooling ring in order to generate a greater temperature difference with respect to the side of the nanogenerator with which the nanogenerator is attached at the rotor. Due to the greater temperature difference, the nanogenerator generates more electrical energy.

According to one preferred example embodiment of the invention, a side of the nanogenerator or of the cooling ring facing away from the rotor is configured for being at least partially sprayed with a coolant. The coolant is designed, in particular, as cooling liquid, for example, based on oil or based on water. For example, the coolant is formed as oil. The coolant is provided, on the one hand, for absorbing and dissipating heat and, on the other hand, for lubricating parts or components to which the electric machine is operatively connected, for example, a transmission or at least gearwheels and/or bearing elements. Oil is utilized in many electric machines in order to cool the winding overhangs of the stator, and so at least one or multiple spray nozzle(s) is/are already provided therefor in the housing of the electric machine. Consequently, the side of the nanogenerator that faces away from the rotor is actively cooled by coolant, optionally via the cooling ring and coolant, in order to generate a greater temperature difference with respect to the side of the nanogenerator with which the nanogenerator is attached at the rotor. As a result, the nanogenerator generates more electrical energy. Moreover, due to the cooling ring, the nanogenerator, regardless of the arrangement and design of the nanogenerator, benefits from the cooling oil during the entire revolution and not only in the instant in which the cooling oil passes the spray nozzle. Therefore, the number of spray nozzles that are configured for cooling the nanogenerator can also be reduced, at best to a single spray nozzle.

According to one particular example embodiment of the invention, the cooling ring is formed from a material having good thermal conductivity, in particular either from a steel alloy or an aluminum alloy or a copper alloy. For example, the cooling ring has a thermal conductivity of at least forty (40) W/mK, preferably of at least one hundred and fifty (150) W/mK, further preferably of at least three hundred (300) W/mK, in particular of at least three hundred and eighty (380) W/mK. The thermal conductivity has the unit, in the SI unit system, of watts per meter-Kelvin (W/mK). For example, the thermal conductivity can be determined by the laser or light flash method (LFA). Alternatively, the thermal conductivity can be determined by the transient hot bridge method (THB). Both methods are well known from the prior art.

According to one preferred example embodiment of the invention, the cooling ring is arranged spaced apart from the signal processing unit and does not cover the signal processing unit. As a result, the radio characteristics of the signal processing unit are not affected by the cooling ring, and so the transmission of the measured data to the control device is not adversely affected.

According to one preferred example embodiment of the invention, the cooling ring has a fin structure. A fin structure is to be understood as multiple fins, which extend away from the cooling ring and enlarge the surface of the cooling ring, as the result of which the cooling potential of the cooling ring increases.

According to a first example embodiment, the fin structure includes multiple fins extending radially from an inner circumference to an outer circumference of the cooling ring, which are designed to be uniformly spaced apart from one another in the circumferential direction. In particular, the radially formed fins extend in the axial direction away from an end face of the rotor.

According to a second example embodiment, the fin structure includes multiple fins formed extending in the circumferential direction, which are designed to be radially uniformly spaced apart from one another. In particular, the radially formed fins extend in the axial direction away from an end face of the rotor.

According to one preferred example embodiment of the invention, the at least one sensor element is integrated in the signal processing unit. Consequently, the at least one sensor element and the signal processing unit form one single component, which is arranged at the rotor.

An electric machine according to example aspects of the invention includes a coolant system for cooling the electric machine, a control device for the open-loop control of the electric machine, and a stator and a rotor according to example aspects of the invention, wherein at least one spray nozzle of the coolant system is configured for cooling the nanogenerator with a coolant. In particular, the coolant system of the electric machine is also configured for cooling an outer surface of the nanogenerator, wherein at least one or multiple spray nozzle(s) is/are provided therefor. The control device is preferably arranged in the vehicle and is utilized for the open-loop and closed-loop control of the electric machine.

Example aspects of the invention also relate to a vehicle having an electric machine according to example aspects of the invention. In particular, the vehicle is designed as a motor vehicle, for example, a passenger car, wherein the electric machine is configured as a prime mover of the vehicle in order to at least partially or completely electrically drive the vehicle. Consequently, the vehicle is preferably designed as a hybrid vehicle or as an electric vehicle.

BRIEF DESCRIPTION OF THE DRAWINGS

Multiple preferred example embodiments of the invention are explained in greater detail in the following with reference to the drawings, wherein identical elements are labeled with the same reference character, wherein.

DETAILED DESCRIPTION

Figure 1:
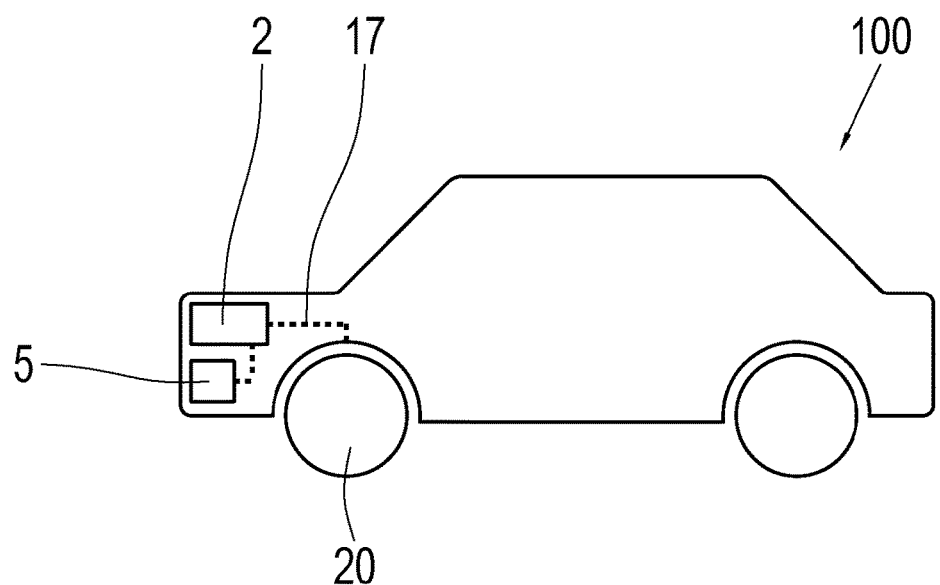
FIG. 1 shows a highly simplified schematic of a vehicle including an electric machine according to example aspects of the invention.

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

According to FIG. 1, a vehicle 100 includes an electric machine 2 according to example aspects of the invention, which is configured for driving the vehicle 100. For this purpose, the electric machine 2 is drivingly connected, for example, via shafts 17 and, optionally, via further components, to driving wheels 20 of the vehicle 100. Moreover, the electric machine 2 is actuated and operated by a control device 5, which is arranged in the vehicle 100. In particular, the control device 5 is utilized for protecting the electric machine 2 against overheating during the operation, in that the maximum power of the electric machine 2 is adapted, in particular to a currently measured temperature of the rotor 1. For this purpose, the control device 5 is connected to the electric machine 2 in a signal-transmitting manner.

Figure 2:
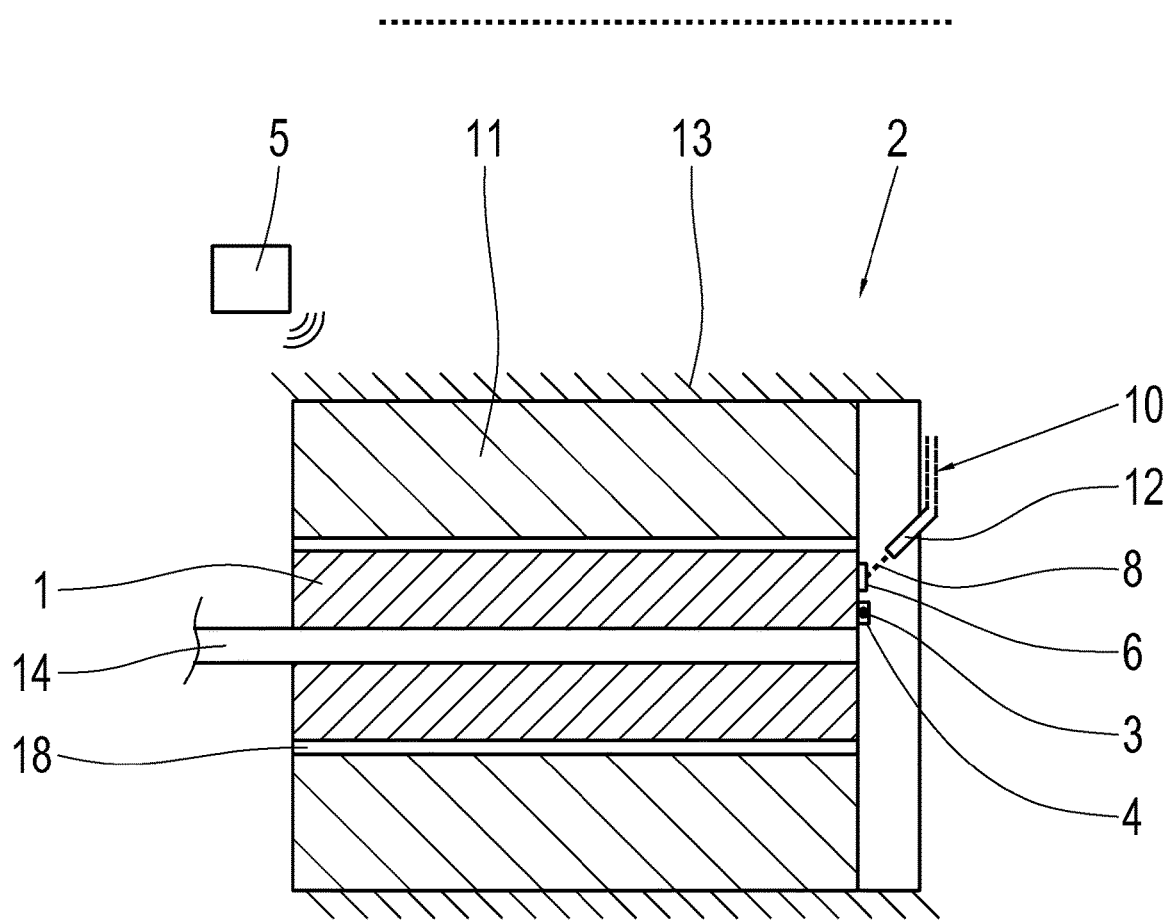
FIG. 2 shows a highly simplified diagrammatic sectioning of the electric machine according to example aspects of the invention including a stator and a rotor.

FIG. 2 shows the electric machine 2, which includes a coolant system 10 for cooling the electric machine 2, the control device 5 for the open-loop control of the electric machine 2, and a stator 11 and a rotor 1. An air gap 18 is formed between the stator 11 and the rotor 1. The rotor 1 is rotationally fixed to a rotor shaft 14. In the housing 13 of the electric machine 2, a spray nozzle 12 of the coolant system 10 is configured for cooling a nanogenerator 6 with a coolant 8. The nanogenerator 6 is arranged on an end face of the rotor 1. In addition to the nanogenerator 6, a sensor element 3 and a signal processing unit 4 are also fixedly arranged on an end face of the rotor 1. The spray nozzle 12 sprays the coolant 8 onto the rotor 1 on an end face and, in fact, in the area of the rotor 1 where the nanogenerator 6 is arranged.

Figure 3:
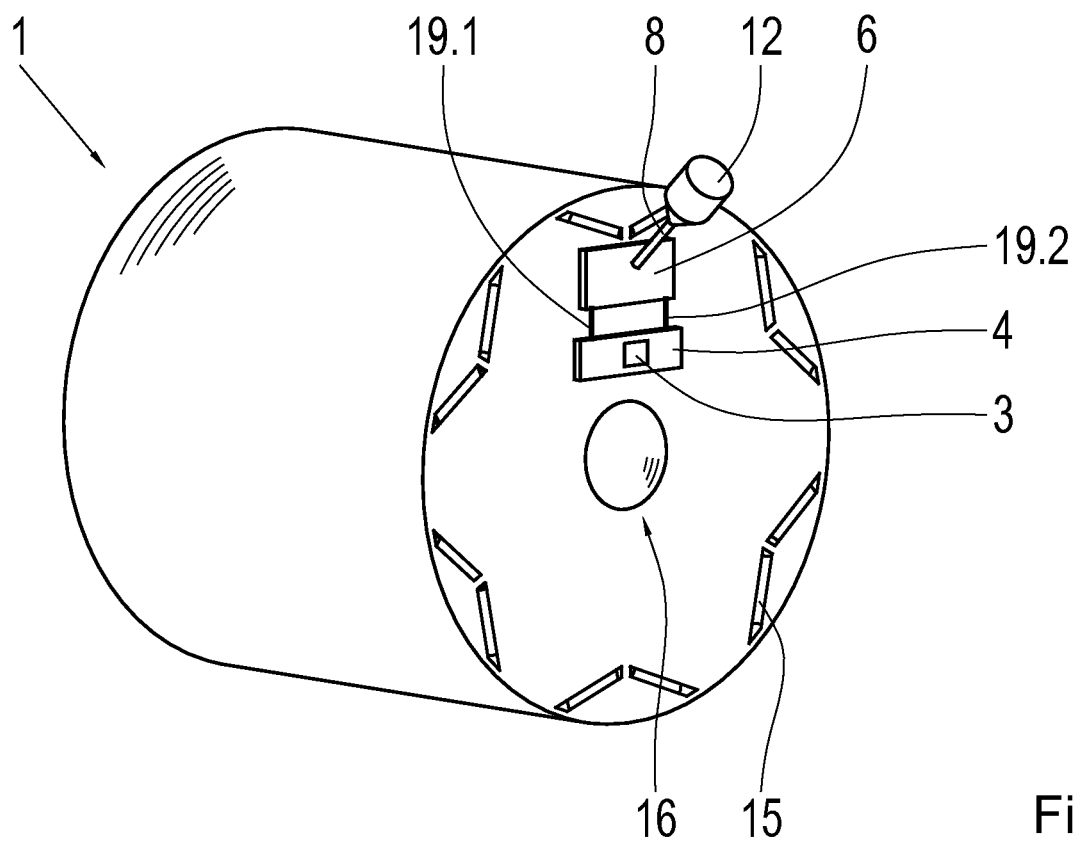
FIG. 3 shows a highly simplified perspective schematic of the rotor according to example aspects of the invention of the electric machine according to FIG. 2.

In FIG. 3, the rotor 1 of the electric machine 2 according to FIG. 2 is represented in an enlarged and perspective view. FIG. 3 shows one of the two end faces of the rotor 1, wherein the end-face arrangement of the nanogenerator 6, the sensor element 3, and the signal processing unit 4 is represented. In the present case, the sensor element 3 is integrated in the signal processing unit 4 and, thereby, is arranged within the signal processing unit 4. Consequently, the sensor element 3 and the signal processing unit 4 form a unit. Moreover, multiple magnets 15 are arranged in the laminated core of the rotor 1 and a central recess 16 is formed in the laminated core of the rotor 1. Two magnets 15 form one pole in each case, wherein a total of six poles are formed at the rotor 1 in the present case. The rotor shaft is hidden in the present case and, thereby, is not represented.

The sensor element 3 measures a temperature at the rotor 1 as a condition variable of the rotor 1 and transmits this condition variable to the signal processing unit 4. Optionally, multiple sensor elements 3 can be arranged at the rotor 1, which detect, for example, different condition variables of the rotor 1. The signal processing unit 4 generates measured data from the detected condition variables of the rotor 1 and transmits the measured data to the control device 5 installed in the vehicle 100. According to FIG. 2, the control device 5 is connected to the signal processing device 4 at the rotor 1 wirelessly, for example, via radio, and is configured for actuating the electric machine 2 under consideration of demands of a driver as well as operating parameters of the electric machine 2, in particular, operating parameters and/or condition variables of the rotor 1.

Energy harvesting is performed in order to supply the sensor element 3 and the signal processing unit 4 with electrical energy, wherein, in the present case, the nanogenerator 6 is designed as a thermocouple and the electrical energy is generated from a temperature difference between two sides of the nanogenerator 6. When the rotor 1 heats up, the side of the nanogenerator 6 with which the nanogenerator 6 is attached at the rotor 1 heats up to a greater extent than the side of the nanogenerator 6 that faces away from the rotor 1 and faces the surroundings. This outwardly facing side of the nanogenerator 6 is actively cooled in the present case via coolant 8 from the spray nozzle 12 of the coolant system 10, and so the temperature difference between the outer side and the inner side of the nanogenerator 6 is increased and, as a result, the voltage that the nanogenerator 6 generates is also increased. The nanogenerator 6 is arranged at an end-face segment of the rotor 1 and, thereby, does not extend over the entire circumference at the end face of the rotor 1. In the present case, the nanogenerator 6 is designed to be rectangular and particularly compact. The nanogenerator 6 is connected to the signal processing unit 4 and the sensor element 3 arranged therein via a first electrical line 19.1 and a second electrical line 19.2.

Figure 4:
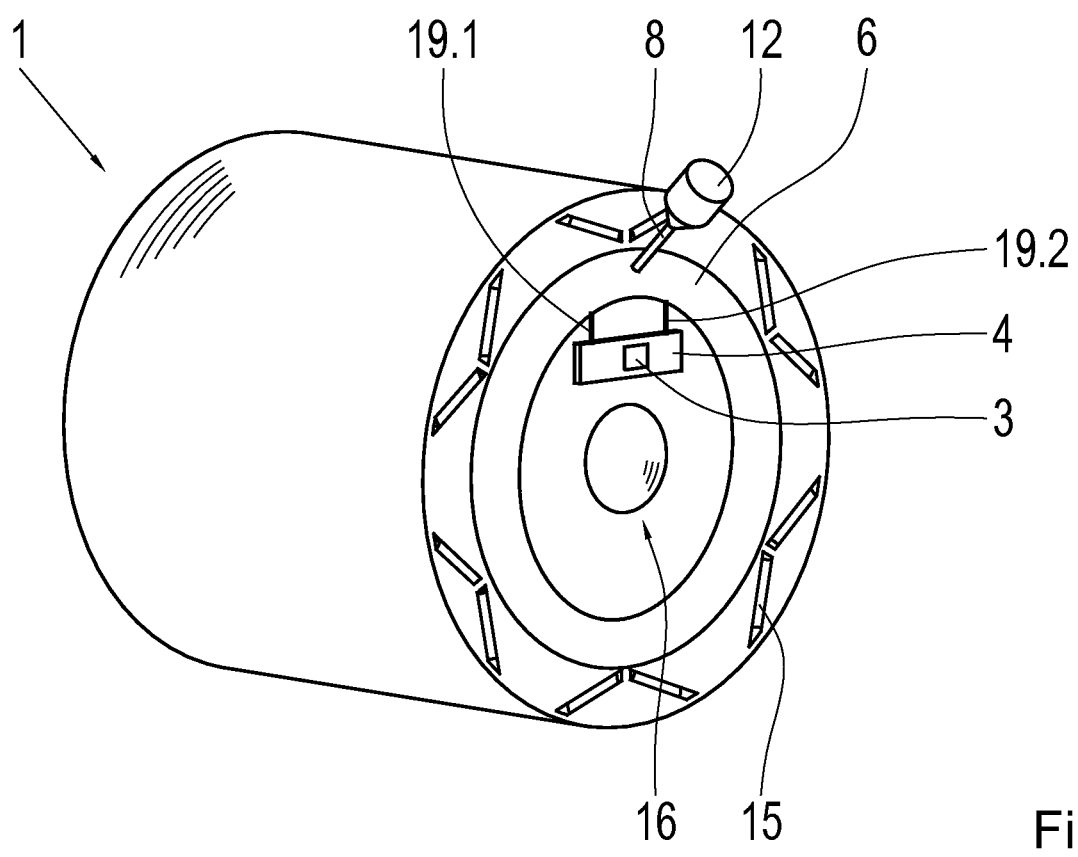
FIG. 4 shows a highly simplified perspective schematic of the rotor according to example aspects of the invention, according to a second exemplary embodiment.

The example embodiment of the rotor 1 according to FIG. 4 differs from the example embodiment of the rotor 1 according to FIG. 3 in that the nanogenerator 6 merely has a different shape, namely is designed circumferentially at the rotor 1 in the shape of a ring. Therefore, reference is made to the above-described first example embodiment of the rotor 1 according to FIG. 3. The nanogenerator 6 formed circumferentially at the rotor 1 in the shape of a ring has the advantage that, during the entire revolution of the rotor 1, coolant 8 from a single spray nozzle 12 cools the outwardly directed side of the nanogenerator 6 continuously and not only in the instant in which the nanogenerator 6 passes the spray nozzle 12 during the revolution. The ring-shaped nanogenerator 6 has an outer circumference and an inner circumference and is arranged coaxially to the central recess 16.

Figure 5:
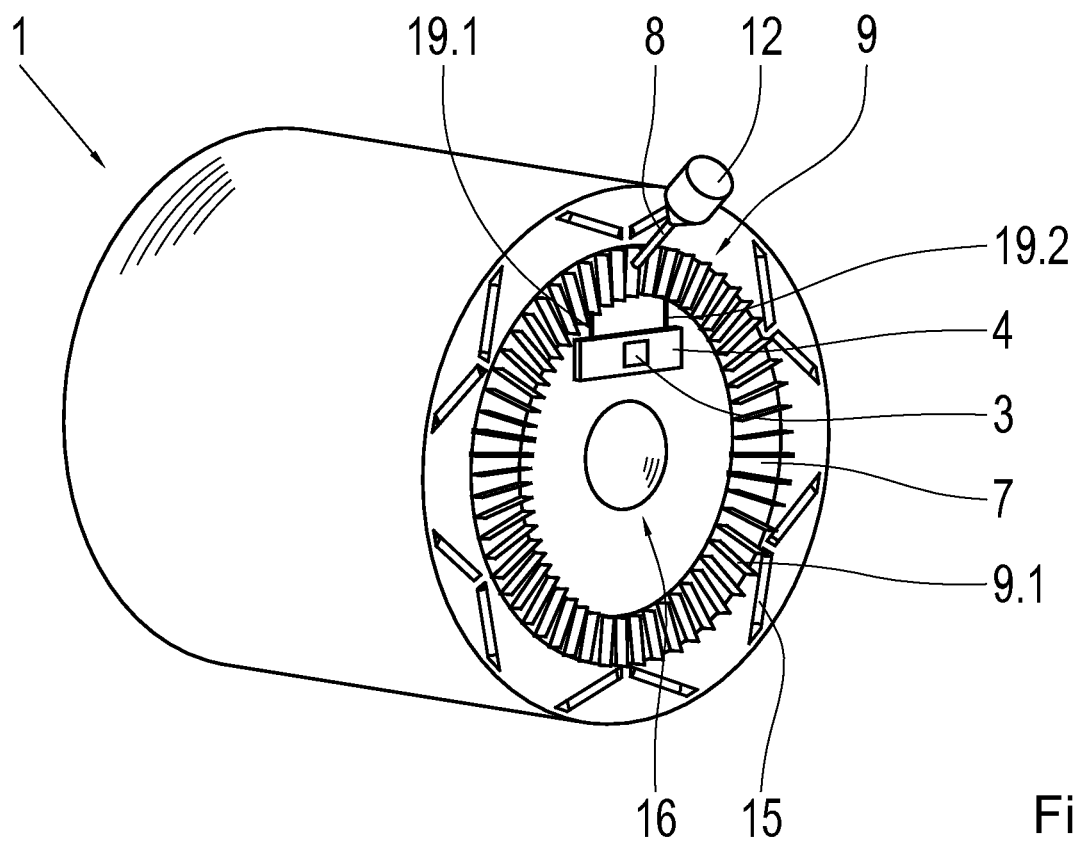
FIG. 5 shows a highly simplified perspective schematic of the rotor according to example aspects of the invention, according to a third exemplary embodiment.

The example embodiment of the rotor 1 according to FIG. 5 differs from the example embodiment of the rotor 1 according to FIG. 3 in that a cooling ring 7 is arranged on an end face of the rotor 1 and, in fact, in such a way that the cooling ring 7 completely covers the nanogenerator 6. Therefore, the nanogenerator 6 is not visible in FIG. 5, although the nanogenerator 6 is designed and arranged in the identical manner as the nanogenerator 6 according to FIG. 3. Reference is therefore made to the above-described first example embodiment of the rotor 1 according to FIG. 3. The cooling ring 7 is designed circumferentially at the rotor 1 in the shape of a ring and is fixedly connected to the rotor 1 and the nanogenerator 6. In the present case, the cooling ring 7 is made of an aluminum alloy, which forms a good compromise between a sufficient strength for maximum rotational speeds of the rotor 1 and a good thermal conductivity for the better cooling of the outwardly directed side of the nanogenerator 6.

The cooling ring 7 has an outer circumference and an inner circumference and is arranged coaxially to the central recess 16. Moreover, the cooling ring 7 is arranged spaced apart from the signal processing unit 4 and does not cover the signal processing unit 4. Moreover, the cooling ring 7 has a fin structure 9, wherein the fin structure 9 includes multiple fins 9.1 extending radially from an inner circumference to an outer circumference of the cooling ring 7 and formed uniformly spaced apart from one another in the circumferential direction. Due to the fin structure 9, the surface of the cooling ring 7 is increased and, as a result, the cooling potential is also increased.

Figure 6:
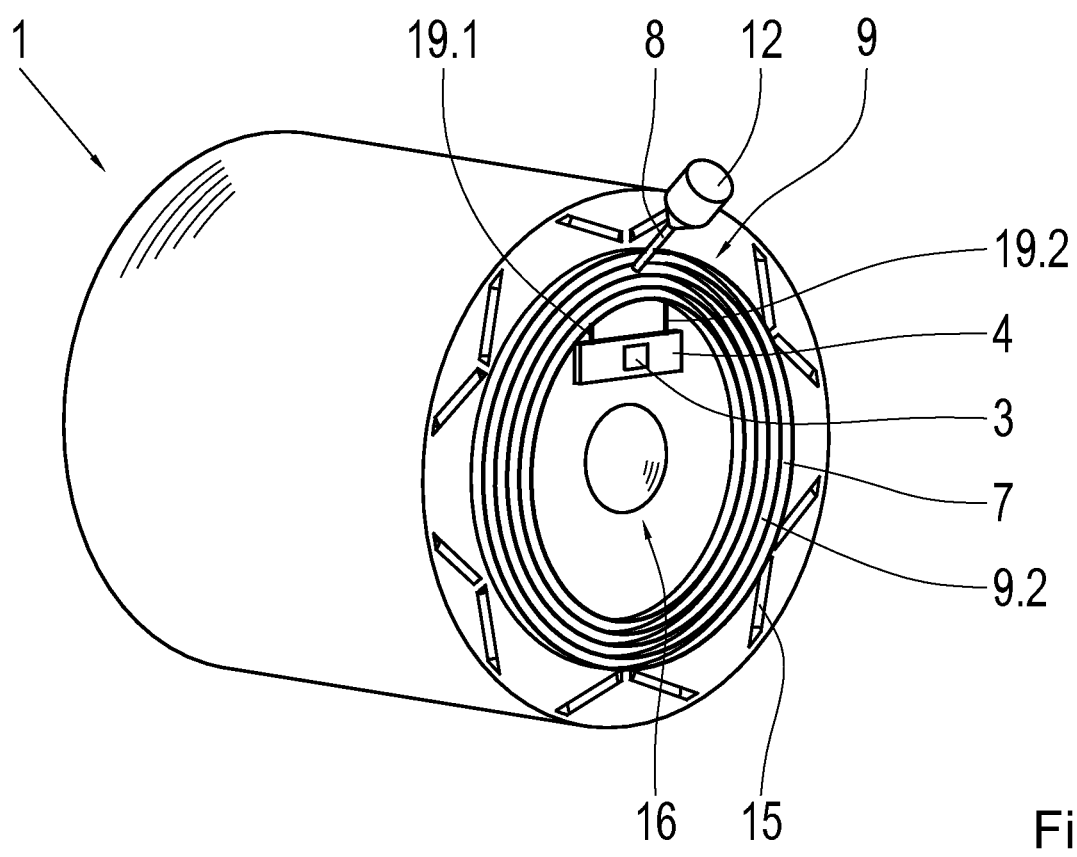
FIG. 6 shows a highly simplified perspective schematic of the rotor according to example aspects of the invention, according to a fourth exemplary embodiment.

The example embodiment of the rotor 1 according to FIG. 6 differs from the example embodiment of the rotor 1 according to FIG. 5 merely in that the cooling ring 7 has a different fin structure 9. Therefore, reference is made to the above-described third example embodiment of the rotor 1 according to FIG. 5 and to the reference made there to FIG. 3. The fin structure 9 of the cooling ring 7 is made up of multiple fins 9.2 formed extending in the circumferential direction, which are designed to be radially uniformly spaced apart from one another. Each of the fins 9.2 forms a closed circle. The circumferentially formed fins 9.2 are arranged coaxially to the central recess 16.

In one alternative example embodiment (not represented here) of the rotor 1, the cooling ring 7 is designed without a fin structure. Consequently, the cooling ring 7 has an essentially smooth surface, instead of cooling fins. A cooling ring 7 of this type essentially corresponds to the nanogenerator 6 according to FIG. 4 with respect to shape and arrangement.

Modifications and variations can be made to the embodiments illustrated or described herein without departing from the scope and spirit of the invention as set forth in the appended claims. In the claims, reference characters corresponding to elements recited in the detailed description and the drawings may be recited. Such reference characters are enclosed within parentheses and are provided as an aid for reference to example embodiments described in the detailed description and the drawings. Such reference characters are provided for convenience only and have no effect on the scope of the claims. In particular, such reference characters are not intended to limit the claims to the particular example embodiments described in the detailed description and the drawings.

REFERENCE CHARACTERS 1 rotor
2 electric machine
3 sensor element
4 signal processing unit
5 control device
6 nanogenerator
7 cooling ring
8 coolant
9 fin structure
9.1 radially extending fins
9.2 circumferential fins
10 coolant system
11 stator
12 spray nozzle
13 housing
14 rotor shaft
15 magnet
16 recess
17 shaft
18 air gap
19.1 first electrical line
19.2 second electrical line
20 driving wheel
100 vehicle

The invention claimed is:

1. A rotor (1) for an electric machine (2), comprising:
at least one sensor element (3) configured for detecting at least one condition variable of the rotor (1);
a signal processing unit (4) connected to the at least one sensor element (3) and configured for generating measured data from the detected condition variable of the rotor (1) and transmitting the measured data to a control device (5);
a nanogenerator (6) configured for generating electrical energy from at least one surroundings variable and supplying the at least one sensor element (3) and the signal processing unit (4) with the electrical energy, the nanogenerator (6) arranged on an end face of the rotor (1); and
a cooling ring (7) arranged on the end face of the rotor (1), wherein the cooling ring (7) at least partially or completely covers the nanogenerator (6), and an outer surface of the cooling ring (7) that faces away from the rotor (1) is larger than an outer surface of the nanogenerator (6) that faces away from the rotor (1).

2. The rotor (1) of claim 1, wherein the nanogenerator (6) is ring-shaped and arranged circumferentially at the rotor (1).

3. The rotor (1) of claim 1, wherein the at least one sensor element (3) is integrated in the signal processing unit (4).

4. The rotor (1) of claim 1, wherein the nanogenerator (6) comprises a thermocouple.

5. The rotor (1) of claim 1, wherein a side of the nanogenerator (6) or the cooling ring (7) facing away from the rotor (1) is configured to be at least partially sprayed with a coolant (8).

6. The rotor (1) of claim 1, wherein the cooling ring (7) is formed from a steel alloy, an aluminum alloy, or a copper alloy.

7. The rotor (1) of claim 1, wherein the cooling ring (7) has a thermal conductivity no less than forty watts per meter-Kelvin.

8. The rotor (1) of claim 1, wherein the cooling ring (7) is spaced apart from the signal processing unit (4) and does not cover the signal processing unit (4).

9. The rotor (1) of claim 1, wherein the cooling ring (7) comprises a fin structure (9).

10. The rotor (1) of claim 9, wherein the fin structure (9) comprises a plurality of fins (9.1) extending radially from an inner circumference to an outer circumference of the cooling ring (7) and uniformly spaced apart from one another in a circumferential direction.

11. The rotor (1) of claim 9, wherein the fin structure (9) comprises a plurality of fins (9.2) extending in a circumferential direction and radially uniformly spaced apart from one another.

12. The rotor (1) of claim 1, wherein a side of the nanogenerator (6) facing away from the rotor (1) is configured to be at least partially sprayed with a coolant (8).

13. An electric machine (2), comprising:
   a coolant system (10) for cooling the electric machine (2);
   a control device (5) for an open-loop control of the electric machine (2);
   a stator (11); and
   the rotor (1) of claim 1,
   wherein at least one spray nozzle (12) of the coolant system (10) is configured for cooling the nanogenerator (6) with a coolant (8).

14. A vehicle (100), comprising the electric machine (2) of claim 13.

* * * * *